(12) United States Patent
Lundquist et al.

(10) Patent No.: US 7,786,436 B1
(45) Date of Patent: Aug. 31, 2010

(54) FIB BASED OPEN VIA ANALYSIS AND REPAIR

(75) Inventors: Theodore R. Lundquist, Milpitas, CA (US); Ketan Shah, Cupertino, CA (US); Tamayasu Anayama, Cupertino, CA (US); Mark A. Thompson, Austin, TX (US)

(73) Assignee: DCG Systems, Inc., Fremont, CA (US)

( * ) Notice: Subject to any disclaimer, the term of this patent is extended or adjusted under 35 U.S.C. 154(b) by 299 days.

(21) Appl. No.: 12/005,086

(22) Filed: Dec. 21, 2007

Related U.S. Application Data

(60) Provisional application No. 60/876,790, filed on Dec. 22, 2006.

(51) Int. Cl.
*G01R 31/304* (2006.01)
(52) U.S. Cl. ...................... 250/309; 324/751
(58) Field of Classification Search .............. 250/309, 250/306; 324/750, 751, 752
See application file for complete search history.

(56) References Cited

U.S. PATENT DOCUMENTS 7,301,146 B2 * 11/2007 Tomimatsu et al. ......... 250/310
7,535,000 B2    5/2009 Phaneuf et al.

OTHER PUBLICATIONS

Rosenkranz et al; Active Voltage Contrast for Failure Localization in Test Structures, Proc. ISTFA 32, Nov. 2006, pp. 316-329.
C.R. Musil, J.L. Bartelt, and J. Melngailis, "Focused Ion Beam Microsurgery for Electronics", IEEE Electron Device Lett EDL-7 (1986), 285.
R. Fredrickson, Use of a Simulated Passive Voltage Contrast Reference CAD Display, Proc. ASM-ISTFA 2006.
K. Miura, K. Nakamae, and H. Fujioka, Development of an EB/FIB Integrated Test System, Microelectronics Reliability 41, Pergamon Press, 2001, pp. 1489-1494.

* cited by examiner

*Primary Examiner*—Kiet T Nguyen
(74) *Attorney, Agent, or Firm*—Deborah W. Wenocur

(57) ABSTRACT

An improved method, apparatus, and control/guiding software for localizing, characterizing, and correcting defects in integrated circuits, particularly open or resistive contact/via defects and metal bridging defects, using FIB technology. An apparatus for identifying an abnormal discontinuity in a contact/via in an integrated circuit comprising a focused ion beam system to scan the ion beam over the contact/via to do remove or deposit via material, a detector to collect a secondary particle signal from the contact/via material that gets removed, a sub-system for storing the secondary particle signal from the contact/via in time as well as x-y scan position, a sub-system for correlating secondary particle signals and identifying discontinuities in the correlated secondary particle signals, a sub-system for optimizing the display of the abnormal discontinuity; and a computer to implement software aspects of the system.

20 Claims, 13 Drawing Sheets

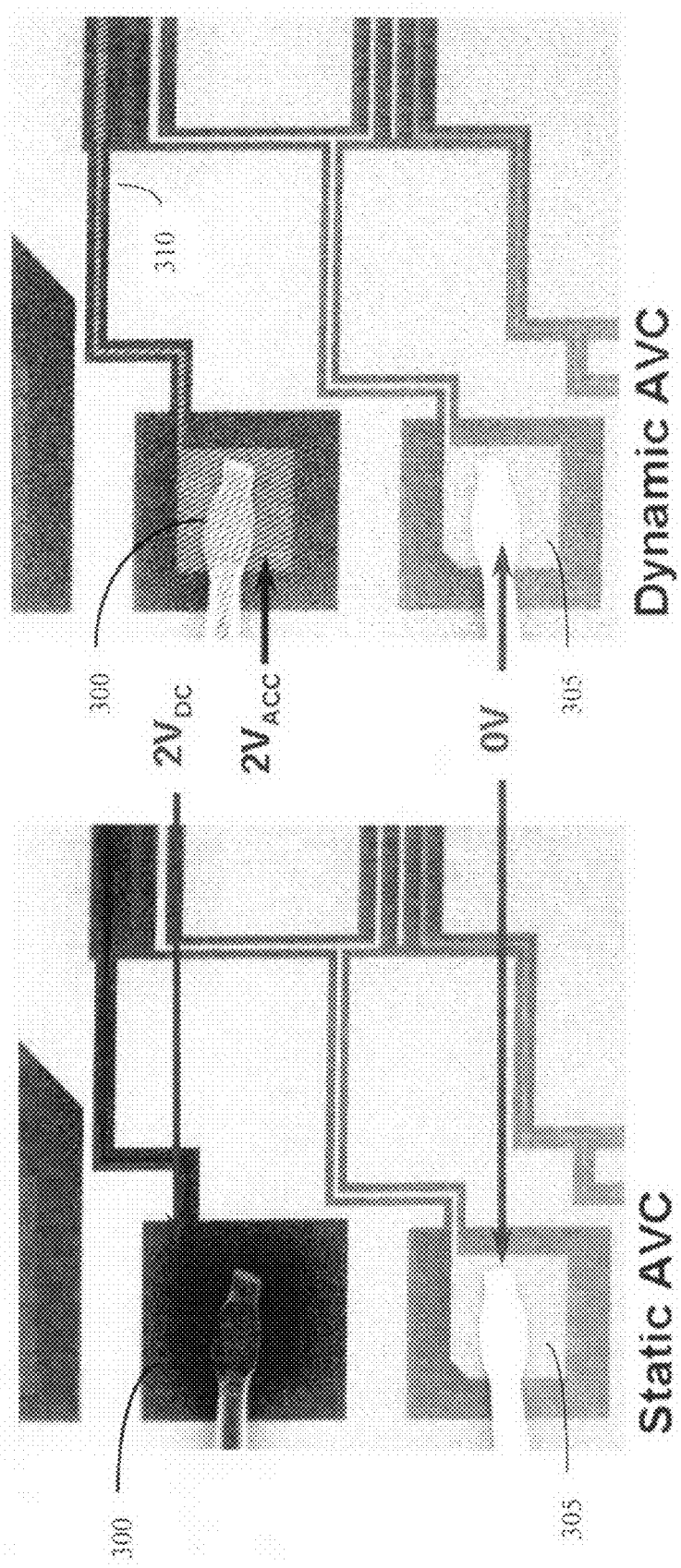

FIB BASED OPEN VIA ANALYSIS AND REPAIR

CROSS-REFERENCE TO RELATED APPLICATION

This application is related to U.S. Provisional Application No. 60/876,790, filed Dec. 22, 2006, and claims priority therefrom.

FIELD OF THE INVENTION

This invention pertains to IC diagnostics and die level fault isolation yield improvement, and more specifically to finding failures in IC's and correcting them so that the fabrication process problems can be identified, design verification can proceed, or design-process interactions can be addressed.

BACKGROUND OF THE INVENTION

As integrated circuit dimensions continue to shrink, methods of failure analysis and debug must be continually refined, both for process and for design issues. One typical failure occurs when vias or contacts (i.e., vertical conducting connections) between metallization layers are either open or shorted laterally. Locating these defective vias/contacts and diagnosing the failure mechanism is crucial to addressing the problem, whether it be in the design or the process.

Accordingly, it is necessary to be able to precisely locate shorted and open vias/contacts on both fully processed electrical test structures for process monitoring, as well as on fully processed die during design debug and to provide yield improvement. It may also occur that location of shorts and/or opens in partially processed or deprocessed test structures is needed. In both of these situations, there may be a dense array or chain of vias/contacts within which the failed cell or cells must be located. Once located, the root cause of the failure must be identified so it can be corrected.

Use of Focused Ion Beam (FIB) for the aforementioned purpose is known, as well as use of the FIB in conjunction with Voltage Contrast techniques, as a failure analysis fault isolation tool to quickly identify and localize shorted and open vias/contacts, as described below. This is described by Rosenkranz et al in *Active Voltage Contrast for Failure Localization in Test Structures*, Proc. ISTFA 32, November 2006, pp 316-320, which is hereby incorporated by reference.

Passive Voltage Contrast (PVC), i.e., voltage contrast where no voltage is applied to the device, is a phenomenon seen while inspecting a semiconductor device with a charged particle beam tool such as a scanning electron microscope (SEM) or a FIB, where an image is seen according to secondary electrons emitted from the sample upon exposure to the beam. Impinging charged particles tend to charge a floating metal line according to the type of impinging particles and the yield of emitted charged particles: e.g., impinging electrons will charge it negative for low energies (energies less than ~1 keV, depending on the material) and very high energies (energies '>100 keV for which the penetration depth is large) where the secondary electron yield is less than 1, thereby increasing secondary electron emission. Impinging electrons with energies which produce secondary electron yields >1 will charge the floating metal line positive, thereby decreasing secondary electron emission. Impinging atoms and ions may also charge the line positive. Circuit features at a given layer have a different level of contrast depending on whether that feature has an electrical path to ground, an electrical path to another circuit element, or has an open connection. This results from differences in the charging of the feature in response to the beam, which affects the number and energy of secondary electrons emitted. A common method of fault isolation during failure analysis is to use these contrast levels to determine if a feature is incorrectly connected, which then indicates that defect such as an open or short is present. PVC locates open/short defects with much finer resolution than does light optics.

FIG. 1a illustrates the use of PVC to locate an open contact in a contact chain. Location 100, where there is a transition from bright vias/contacts 105 to dark vias/contacts 110, indicates a discontinuity in the circuit at that location, presumably due to an open or highly resistive via. FIG. 1b shows the formation of via chains relative to the surface 115 of the layer being probed. The via chain extends below the surface. If the transition from bright to dark occurs at location 100 on the surface, there is still uncertainty as to which via in region 120 is defective.

Use of FIB for PVC induces a greater contrast signal than does use of an SEM, for several reasons: 1) Both the incident positive ions from the FIB beam and the ejected secondary electrons contribute to the positive charging of the metal line, in comparison to the SEM case where there must be more secondary electrons ejected than primary electrons from the electron beam incident in order for charging to occur; 2) The number of secondary electrons ejected by a FIB tends to be higher than from an SEM at the typical energies used by each (approximately 30 keV for FIB, approximately 1 keV for SEM); and 3) The average energies of the secondary electrons from an SEM are greater than from a FIB: this means that fewer of the FIB secondary electrons will not escape the charged feature at lower levels of charging than for the SEM, because they do not have sufficient kinetic energy to escape the charged feature. For an SEM if the number of secondary electrons emitted is too low there can actually by negative charging occurring, which would increase the number of secondary electrons emitted. For an SEM, as the incident beam energy is lowered to a value of approximately 1 keV, the secondary electron emission coefficient (the ratio between the number of secondary electrons emitted to the number of incident electrons) falls below 1, with the exact value dependent on the material. Negative charging occurs when the emission coefficient falls below 1. For all of the aforementioned reasons, use of an SEM does not provide as good a voltage contrast compared with the use of FIB.

PVC imaging utilizes charging of electrically isolated conductors in comparison to the dissipation of charge in grounded conductors to provide the aforementioned contrast in the secondary electron image. A floating conductor quickly gets dark when imaging, as it becomes positively charged up and the low energy secondary electrons cannot escape. A short provides a direct conductive path to ground. This results in more secondary electrons collected and a brighter image on a grounded conductor. The secondary electron images show grounded conductors as bright and floating conductors as dark, on the background of the dielectric (which also appears dark, since with no conductivity to ground, dielectrics charge up and appear dark).

In order to obtain the VC image, the IC features to be tested must be uncovered and exposed to the charged particle beam. This is known as "deprocessing" or "delayering". Generally, devices to be examined by SEM are deprocessed by parallel polishing to remove metal interconnects above the nodes to be examined. This mechanical lapping is generally the preferred technique, although chemical deprocessing techniques may be used also. This parallel processing is quite time consuming, since after etching each layer, the device must be returned to and viewed in an SEM to re-establish the "signal", and then the parallel process/SEM cycle is repeated until the defect is found by VC, typically requiring several iterations.

Another weakness of the parallel process/SEM cycle is that the SEM can not identify issues in the next level, thus delayering may passes through the defect and detailed information of the defect is lost. However, most of the time, knowing the level at which the defect occurs can be sufficient to correct the fabrication process.

Use of FIB in place of SEM for VC imaging provides more flexibility in method. For example, the deprocessing can be done using parallel lapping as described above, or chemistry-assisted FIB can drive the deprocessing directly and locally. This requires selectively etching an opening using the FIB beam layer by layer until the failure is found. The FIB box, i.e., the window etched, is typically 20×20 microns. The FIB etching is generally endpointed at the top of the metal lines. The success rate of locating open vias/contacts in a chain using the FIB method outlined above is approaching 100% if the via/contact chain is truly open and not failing due to high resistance. FIB-induced passive voltage contrast is visible, i.e., provides information, only when the resistance is greater than on the order of 10E10 ohms, as described in C. R. Musil, J. L. Bartelt, and J. Meingailis, "*Focused Ion Beam Microsurgery for Electronics*", IEEE Electron Device Lett EDL-7 (1986) 285.)

In order to facilitate finding defect locations, the approximate region is generally determined by scan data from testing, in order to reduce the possible number of defective nodes.

Identifying defects by PVC in test structures which are designed for that purpose can be relatively straightforward under the conditions outlined above, but identifying defects in actual circuits, for example for via chains which extend in z as described above, may be a more complex problem. To address this issue, a Simulated Passive Voltage Contrast Reference may be generated to yield an expected VC image which can be displayed next to the actual VC image. By comparing the reference image representation to what is seen in the actual VC image, defective connections can be more readily identified. The reference display is produced by processing the polygon file of the circuit design such as a GDSII file—(GDSII, invented 27 years ago, is the interchange format between chip design and mask data preparation that has been used on the majority of integrated circuits built since the format's introduction) through an algorithm that simulates the connections at a given layer to the layers below, and outputs a new polygon file with sub-layer markers indicating ground, gate, or open connections. These new layers can then be displayed by gray scale in a way that matches what should be seen in the VC image, e,g, black for open, gray for gate, white for ground. The key concept is to "slice up" conductors based on lower topology net connections. In a polygon viewer, therefore, every metallization level will have line segments assigned grayscale values to closely match the VC imaging as per the connection to the lower connections or lack thereof. When upper levels are removed there can be impact on the VC of lower levels whenever a connection net is interrupted. For example if the connection to ground for an M3 line segment was through an M4 line segment and M4 is removed then the M3 line segment would need to be represented as dark instead of bright. Refinements to the algorithm can be made to generate simulated representations of other types of circuit features to more closely match real, imaged PVC results for the fabrications process. This process is described in *Fault Identification by Use of a Simulated Passive Voltage Contrast Reference CAD Display*, R. Fredrickson, Proc. ASM-ISTFA 2006, which is hereby incorporated by reference.

Once the PVC inspection identifies a possible defect, mechanical nano-probing can be performed to verify the suspected short/open through the creation of I-V curves. It may be necessary to use mechanical nano-probing to inject a voltage if for some reason the VC resolution is poor, possibly due to both ends of the node floating. With the injection of voltage, passive voltage contrast becomes Active Voltage Contrast (AVC), defined as voltage contrast with an additional DC voltage injected into the device.

After the defect type and location is identified, its root cause needs to be determined so that a process or design correction can be made. The VC alone can only localize the defect to a particular via. But the defect can be of many types: e.g., if the via hole was not completely etched, that is one issue; if the via hole has a void in the fill that is another issue; if the via hole was refilled during a photomask removal process, that is still another issue; if the via hole was never etched, that is another issue. Determination of the root cause generally requires a cross sectional micrograph of the defect site, which can be performed using several methods including successive polishing by FIB (the preferred method, mentioned above), and then imaging by either SEM or FIB. When using these FIB techniques described herein for doing the VC imaging, the cross-sectioning is generally performed in situ by the FIB, and then imaged in a Field Emission SEM (FE-SEM). The clarity of the visual depiction of the defect site generally provides sufficient information to move forward with a correction in design or process. FIG. 2 illustrates an SEM of a cross-sectioned open plug, showing the failure mechanism to be a residue, most likely photoresist.

It is important to note that the cross sectioning process, either by FIB or by other means, is essentially destructive to the die, due to cutting and electrically isolating neighboring traces, as well as electrically shorting others during the trenching and polishing steps.

The use of PVC and AVC as described above is quite effective for locating open or shorted via/contact defects, since the voltage contrast is dramatic between powered and grounded features. However, it is considerably less effective for locating resistive failures such as a high-resistance "open" via/contact. Causes for this type of failure can be: process-related; design-related; due to electromigration; or due to an Electrostatic Discharge (ESD) event. A problem arising from the currently used failure analysis methods is that root cause diagnosis using cross-sectioning methods inherently destroys the structure or die. This is a highly costly and time-consuming procedure. Furthermore, if there are two defects in series, these techniques could generally not reveal them.

It would be therefore a significant advance in failure analysis if a technique for via/contact defect location and characterization could be developed which can locate resistive defects, and characterize them without destroying the structure or circuit.

SUMMARY OF THE INVENTION

It is therefore an object of this invention to provide a method for via/contact defect location and characterization which can more accurately locate defects, and in particular, resistive defects, opens, and shorts.

It is another object of this invention to provide a method for defect characterization which does not destroy the structure or circuit, and enables repair of the defects.

These objects are met by the method described herein.

BRIEF DESCRIPTION OF THE DRAWINGS

FIG. 3a shows a FIB image with static active voltage contrast.

FIG. 3b shows a FIB image with dynamic active voltage contrast.

DETAILED DESCRIPTION OF THE INVENTION

Figure 2:
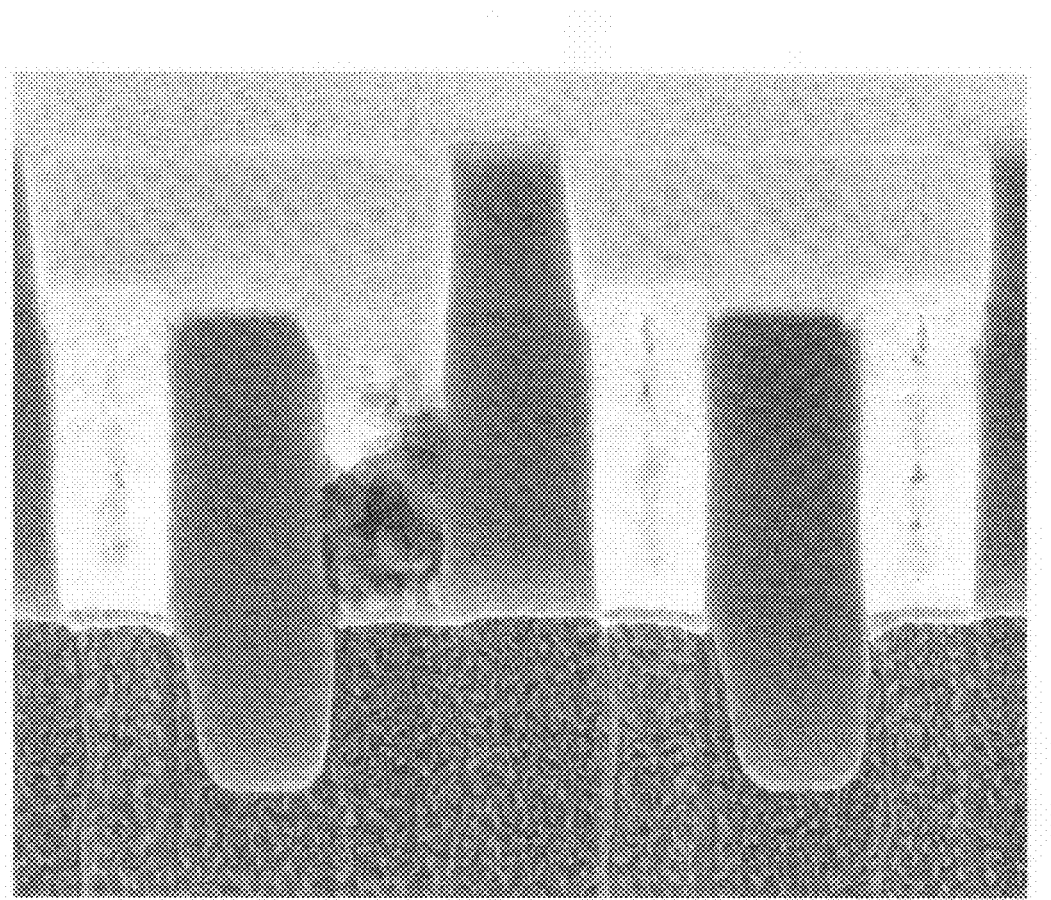
FIG. 2 illustrates an SEM of a cross-sectioned open plug.

A first aspect of this invention is to utilize dynamic active voltage contrast, i.e., active voltage contrast with a non-DC applied voltage, to improve resolution of the VC levels, as will be described hereinafter, and to provide information which can assist in localizing resistive faults. Another description of this aspect is the localizing of an abnormal discontinuity in a contact/via by a defect localization methodology. A comparison of a FIB image with static active voltage contrast vs. a FIB image with dynamic active voltage contrast is shown in FIGS. 3a and 3b. In FIG. 3a, 2V DC is applied to pad 300, and 0V is applied to pad 305. Pad 300 is seen as uniformly dark due to the positive applied voltage inhibiting detection of secondary electrons. In FIG. 3b, 2V ACC is applied to pad 300. In this case a grayscale region shows up both on the interior of pad 300, but also in the interior or metal route 310. As will be seen, this is due in part to the partial discharging of the metal regions during the portion of the AC voltage input which does not apply positive voltage. The dynamic voltage source needs to deliver a signal through a nano-probe to one end of a net. As the device is deprocessed the remaining net is reduced in size. The FIB is expected to enable this by locally deprocessing each node end.

When locally deprocessing down to a specific node with a highly resistive rather than open via, current flow is minimal, for example less than what is needed to keep a net bright in VC under the impinging ions and emitted secondaries. However, by supplying a high frequency signal, with dynamic AVC the signal goes through and can produce a gray level. Since resistive vias are equivalent to capacitive elements, dynamic signals at sufficiently high frequency can produce current flow and decay, resulting in more gradations in gray scale, in contrast to static signals, which simply charge up the capacitors, resulting mainly in dark or light features. A visual indication of transition in grayscale will occur with the dynamic case with a resistive via, similarly to the static case with an open via.

The decay constant of the capacitance of a resistive contact vs. the frequency of the stimulus signal will determine 1) how effectively dynamic voltage contrast can characterize the defect, and 2) how much of a problem the defect will be in the actual operation of the IC at the IC frequency.

Figures 3C, 3D:
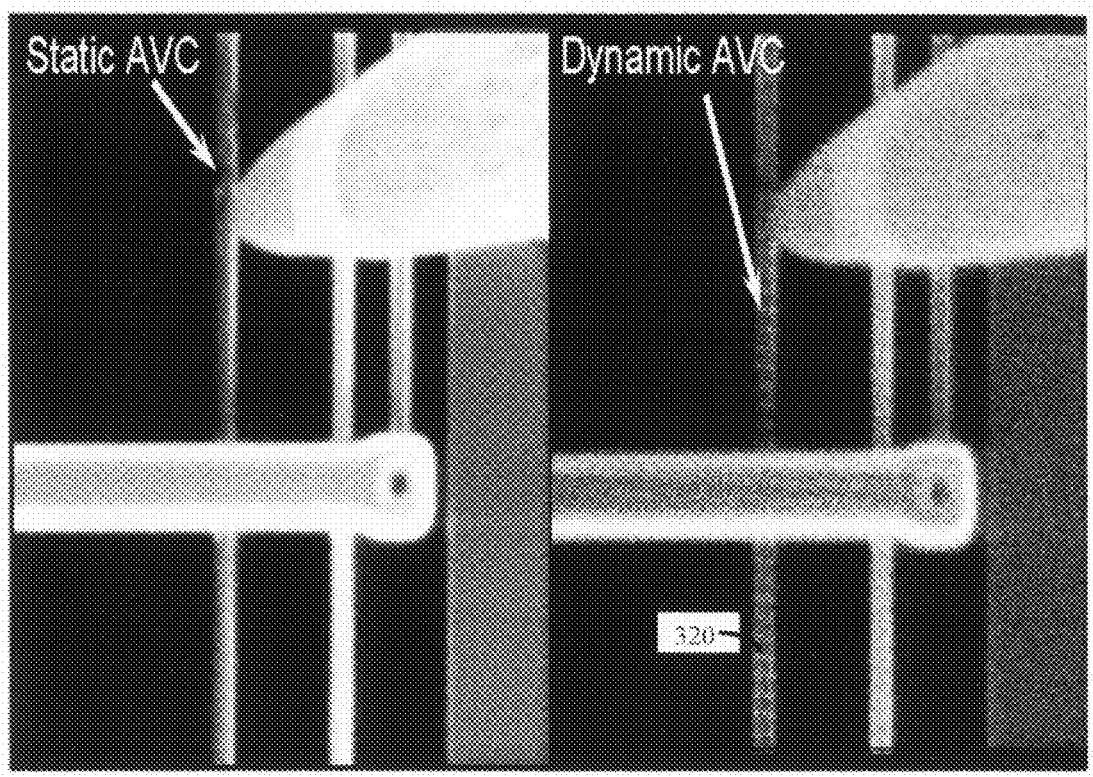
FIG. 3c shows a FIB image of a device biased statically.
FIG. 3d shows a FIB image of a device biased dynamically.

When using dynamic AVC, a stroboscopic effect can be induced by correlating in time the voltage source with the scanning/imaging ion beam. For example, with a 4 f/s (frames per second) ion beam scanning frequency and the voltage source synchronized and at 2 f/s, a "good", i.e., continuous, node appears to blink on and off at a frequency of 2 f/s. A resistive or complete short can result in a blinking effect at a different location than expected. FIGS. 3c and 3d compare FIB images of a device biased statically (FIG. 3c) and dynamically (FIG. 3d). FIG. 3d shows image stripes 320 due to the aforementioned stroboscopic effect. At 30 f/s (frames/second) the line frequency is ~15 kHz (512 lines per frame). With the voltage source at 150 kHz and synchronized to the ion beam scanning ~10 dark bands would appear on an exposed trace crossing the imaged area The stroboscopic effect increases the eye's sensitivity to whatever changes in grayscale exist—whether bright to dark for open circuit or for dynamic active voltage contrast at too high a frequency to allow for discharging of capacitor in resistive defect—or changes in grayscale for dynamic active voltage contrast for resistive defect with proper frequency of stimulation.

Figure 1A:
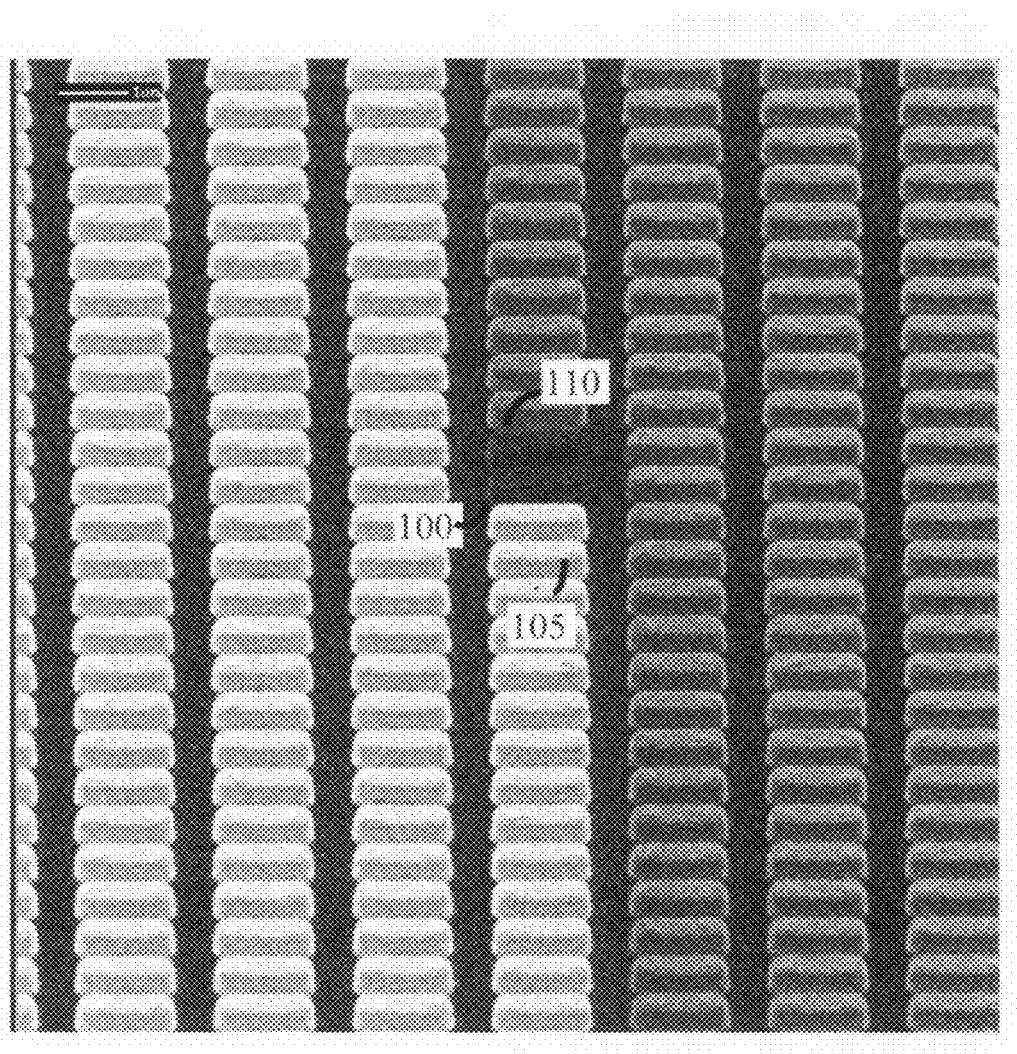
FIG. 1a illustrates the use of PVC to locate an open contact in a contact chain.
Figure 1B:
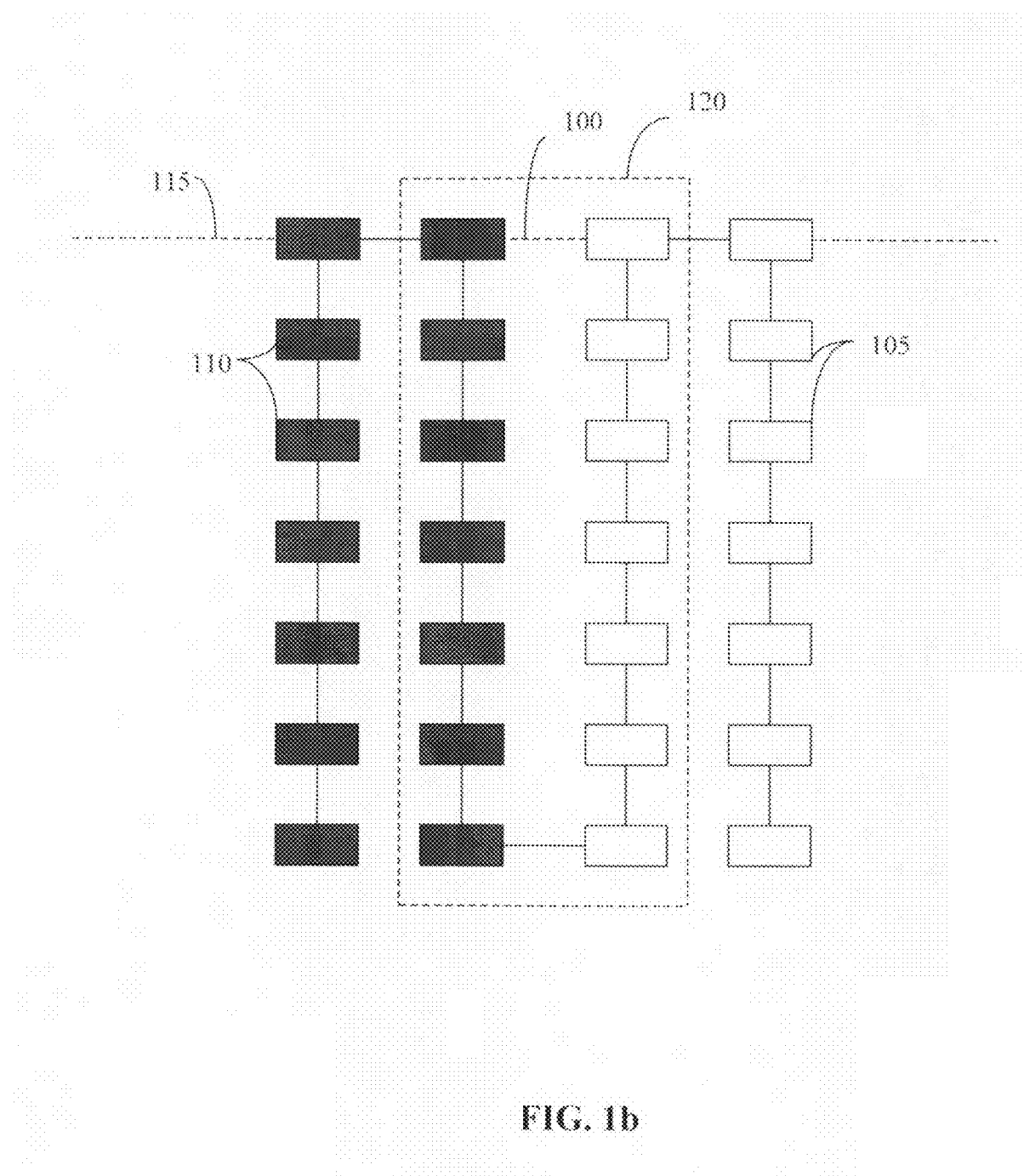
FIG. 1b shows the formation of via chains relative to the surface of the layer being probed.

The use of dynamic AVC enables the location of resistive defects to be determined in closer approximation than for static AVC, particularly in the case illustrated in FIG. 1b, where the position of the observed transition from light to dark or transition in grayscale value does not specify where in z the defective contact/via is found. This is due to the ability to analyze impedance and capacitance effects for an applied AC signal. A simple example of capacitance analysis is described below: a more detailed analysis can be performed using SPICE modeling.

Figure 4A:
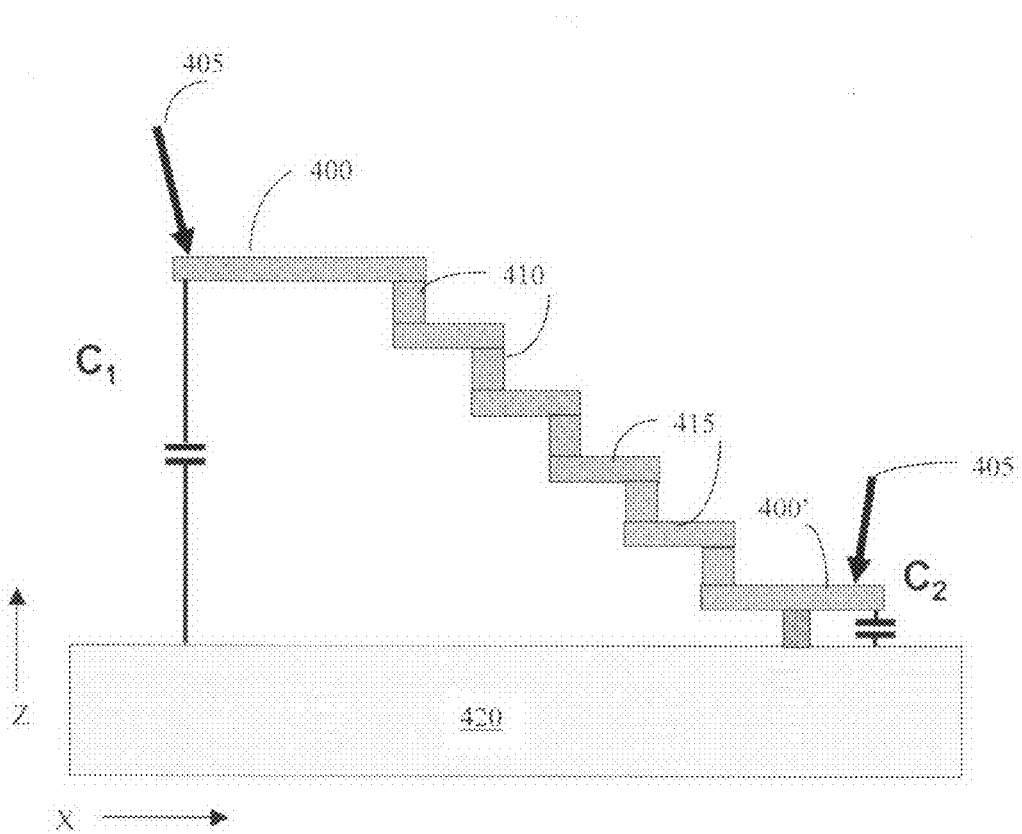
FIG. 4a shows capacitive aspects of a good circuit element.

FIG. 4a shows a good circuit element:

Nano probe measurements (using sub-micron mechanical probing needles, which may be from a scanning probe microscope and which may be in situ within the FIB system) are done on extended metal regions 400 and 400' (which may be pads) as indicated by arrows 405. FIB access for the nanoprobes would be necessary in order to do these measurements: i.e., the FIB would be used to gain access instead of deprocessing. The FIB would locally deprocess in that region. If the opening were big enough the nano-probe could make contact directly, but if the hole was small then the FIB could fill the hole and thereby bring the nanoprobe contact point to the surface. Vertical portions 410 indicate vias between metallization levels. Horizontal portions 415 represent nodes of the metallization net. Si substrate 420 is assumed to be grounded. Note that the actual configuration of vias in three dimensions would likely be similar to that illustrated in FIG. 1b. i.e., extending vertically into the sample.

At each node a capacitance between the node and the substrate exists, which includes the capacitance of the via connecting it to the next node. This capacitance can be measured at regions 400 and 400', to yield values C1 and C2 respectively. Since the capacitors are all in parallel, each of C1 and C2 is equal to the sum of the individual capacitances of the nodes between regions 400 and 400', that is, $C1=C2=\Sigma C_i$ where i=a, b, c . . . to n, for which n is the number of nodes. The capacitances C1 and C2 are equal when measured at either end. The endpoints are inherent to the measurements, but the capacitance of the probes themselves would depend on their locations; considering the capacitance of the two probes to be equal and that both are in contact with the sample when the measurements are made, the probe capacitance is not an issue. When a defect interrupts the capacitance measurement, there is an electrical measurement indication of where the defect is, as is shown below. In addition to the capacitance measurement to substrate, the measurement of capacitance across the net between the nanoprobes gives additional information. Incorporating the modeling data from SPICE modeling can provide the best information about the localization of the defective contact/via from the above capacitive analysis.

Global deprocessing and local deprocessing by FIB is needed for each nanoprobe and these are not indicated in FIG. 4a. Further, between the probes, since the resistances of the vias are in series, for a good element, the total resistance $R = \Sigma R_k$, where k=z, y, x, ... to p, for which p is the number of vias. (When there is a metallization short, i.e., a bridge between two metal features, then a resistive analysis to ground, i.e., the Si substrate, would give results similar to this capacitive analysis for highly resistive contacts/vias. In that case, resistors in parallel would replace capacitors in series, with the defect adding an additional resistor in series rather than an additional capacitor in parallel).

Figure 4B:
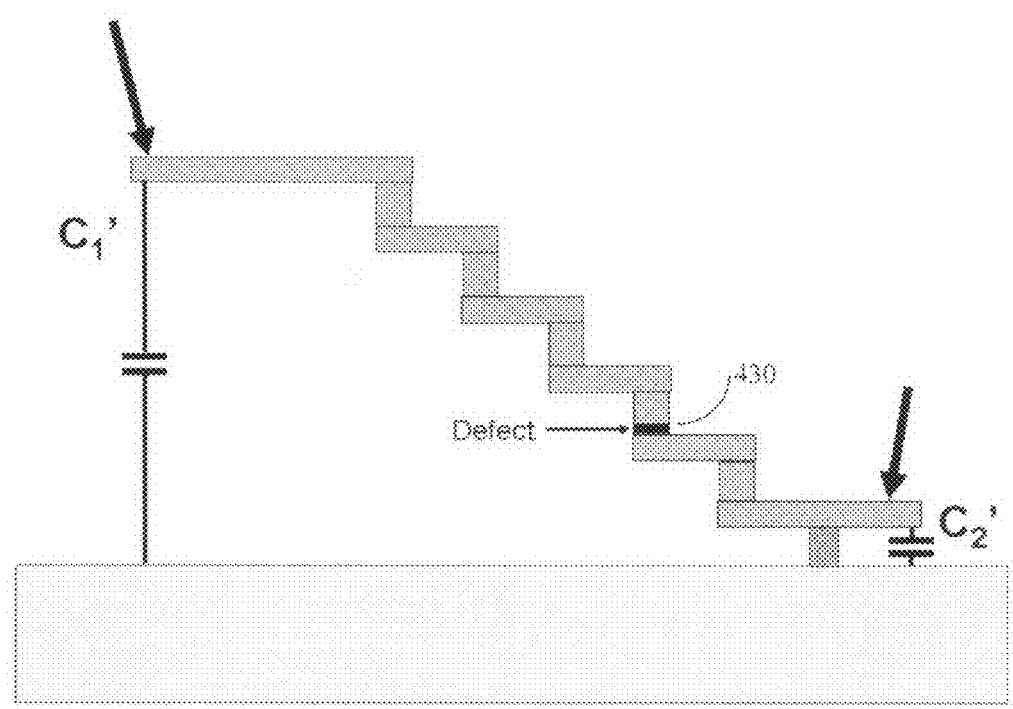
FIG. 4b shows capacitive aspects of a circuit element containing a defect.
Figure 4C:
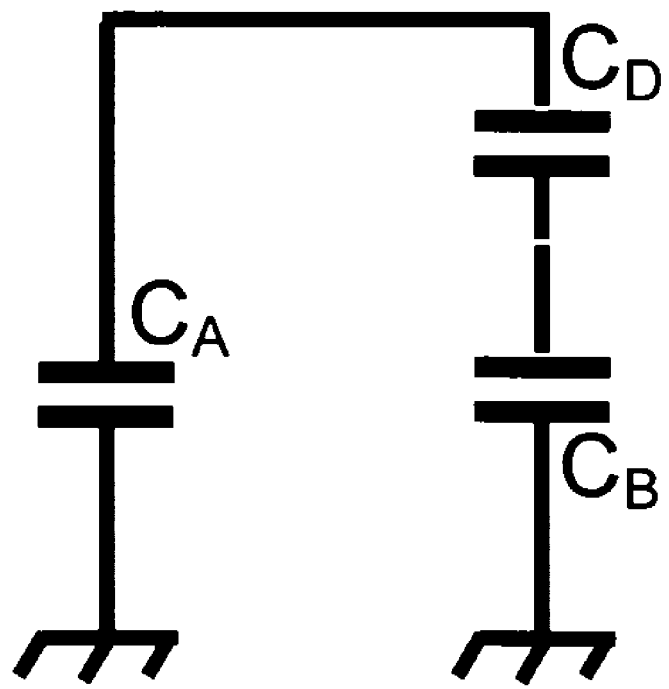
FIG. 4c shows the equivalent circuit for the circuit element of FIG. 4b.

However, when there is a break 430 (or a resistive defect) in the connection, as shown in FIG. 4b, the capacitance changes depending on the end measured. The capacitance can be illustrated by the equivalent circuit shown in FIG. 4c. $C_A$ is the capacitance on one side of the defect, (which is equal to the sums of the individual node capacitances, in parallel) or $C_A = \Sigma C_i$, where i=a, b, c, ... to D, the defect position, and $C_B$ is the capacitance on the other side of the defect, or $C_B = \Sigma C_j$, where j=e, ... to n.

If there is no defect, $C_1$ (the total capacitance of the equivalent circuit)=$C_A + C_B$ But if a defect occurs at position D (430), the capacitance $C_D$ must be included in the circuit as in the figure. Capacitance $C_1'$ including the defect, as measured at region 400, would then equal $C_A$=capacitance measured from C1 and includes the defect $C_B$=capacitance measured from C2 and includes the defect $C_D$=capacitance of the defect $C_1' = C_A + 1/(1/C_B + 1/C_D)$. $C_D$=kA/s, which for the defective via case, k is the dielectric constant of the interposing material, A is the effective area of the via, and s the effective thickness of the defect. When kA/s is large, $C_D$ is large and there will be very little effect on $C_1'$, i.e., $C_1' \approx C_1$. $C_D$ large means $C_D > C_B$ $C_2' \approx C_2 = C_B + C_A$, when $C_D > C_A$ When kA/s is small, ($C_D < C_B$)

$C_1' = C_A + 1/(1/C_B + 1/C_D) \approx C_A + C_D(1 - C_D/C_B)$ $C_2' = C_B + 1/(1/C_A + 1/C_D) \approx C_B + C_D(1 - C_D/C_A)$, assuming $C_D < C_A$ Further, between the probes $R' = R_D + \Sigma R_k$, where k=z, y, x, ... to p, for which p is the number of vias.

By comparing the capacitive measurements from the two ends, a determination can be made as to which end is closer to the defect. For Failure Analysis with these capacitive measurements and using Spice modeling a greater level of localization can be achieved.

There are papers re waveform analysis of dynamic active voltage contrast with ion beam, such as K. Miura, K. Nakamae, and H. Fujioka, *Development of an EB/FIB Integrated Test System, Microelectronics Reliability* 41, Pergamon press, 2001, pp 1489-1494, but to the authors' knowledge dynamic active voltage contrast using an ion beam has not been utilized for the characterization of defects, i.e., doing capacitive/resistive analysis with microprobes to locate defects.

A second aspect of this invention is to apply FIB methods to a fault location detected by the aforementioned techniques, to perform an effective cross section of the location from which the root cause of the fault can generally be determined, without destroying the structure, die, or wafer. Large screen, simultaneous FIB viewing during etching enables identification of the specific defect in x, y, and z, within the process layer in which the failure occurred. The FIB etching window exposes the defect and makes it visible. The preferred method to achieve this is known as pseudo cross sectioning. This method is described in U.S. Provisional application No. 60/733,812, filed Nov. 7, 2005, which is hereby incorporated by reference. This patent application describes methods of enhancing FIB image data during a milling process in order to better characterize the progress of the milling. One application of the method provides improved endpoint characterization. Another application of the method produces a cross sectional image of exactly the portion of the wafer being FIB milled. It involves taking a series of FIB images as a function of time over a region being milled, and from those images generating a cross section image of the milled region. Included in U.S. Provisional application 60/733,812 is a description and manual for a combined hardware/software package called FIB Assist[TM] (FIB Assist is trademarked and owned by Fibics, Ottowa, Ontario Canada.), which provides tools for implementing and analyzing the pseudo-cross section images and data. The FIB Assist system provides means for storing the secondary particle signal from the feature being cross-sectioned, e.g. the via, in time as well as according to x-y scan position.

Figure 5A:
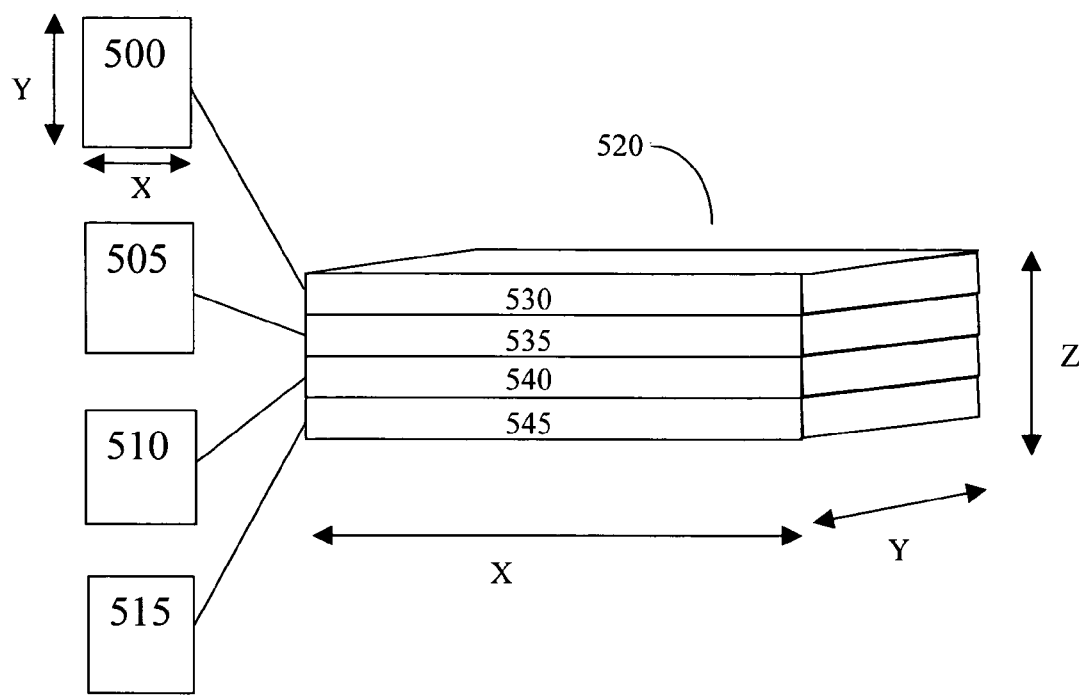
FIG. 5a shows the generation of the cross section image.

The generation of the cross section image is shown in FIG. 5a. Sequential FIB images 500, 505, 510, and 515 are taken as the milling progresses, with image 500 first to be generated in time during a mill, followed sequentially by "thumbnail" images 505, 510, and 515. Thumbnail images are defined as a decreased pixel count, scaled-down rendering of an image. A cross-section stack 520 can be constructed as the thumbnail images are generated. Since thumbnails are reduced in pixel content they restrict the available lateral resolution. They would also restrict vertical resolution due to a decreased ability to use neighboring pixels to optimize the signal-to-noise ratio (SNR) by averaging. The SNR may be the limiting factor in accuracy for this method in single image mode in comparison to SEM's which can image over long periods of time to improve the SNR. However, SEM imaging would not be collecting as much data as quickly as the method described above, since the SEM must either deal with the noise from the milling process, or the process would need to take longer if the milling were stopped each time an image was taken. A line (or thin slice), beginning at top 525 of cross section view 520 is added every time a thumbnail image is produced, and corresponds to a slice, horizontal in the embodiment illustrated here, of the thumbnail. Cross section slices 530, 535, 540, and 545 correspond respectively to thumbnail images 500, 505, 510, and 515. The horizontal x-axis of the cross section 520 corresponds to space, and the vertical z-axis corresponds linearly to time, assuming that the thumbnail images are produced at constant time intervals. Line and width parameters can be user selectable to indicate which area of the thumbnail is used to create the cross section. For example, if the thumbnails are 200×200 raster lines, setting the line parameter to be 100 means that the cross-section will be produced from the middle of the thumbnail image. The width parameter indicates how many raster lines of the thumbnail will be averaged to produce each cross-section line.

Accurate cross sectional imaging of a FIB-milled area is best achieved when the milled region is planar. This may involve milling through multiple materials. Planar milling through multiple materials has been shown to be possible. The techniques for doing this are described in U.S. Provisional Application No. 60/857,943, filed Nov. 11, 2006, which is hereby incorporated by reference in its entirety.

The generation of a cross-sectional image of a FIB-milled area as described above, hereinafter referred to as a "pseudo-cross section", provides a substantial advantage over traditional cross-sectional techniques. It does not necessitate the polishing or cleaving of the sample so as to expose the area to be observed by cross sectioning. The die or wafer therefore is not destroyed by the cross sectioning process. The vertical resolution of the pseudo-cross section depends on the vertical milling rate, which is controlled by the area milled as well as by the beam current. Lateral resolution depends on the pixel count in the milling area. Using lower beam currents allows for improved lateral and vertical resolution. An important advantage of using the pseudo-cross section technique is that the pseudo-cross section can be viewed along either the x- or y-axis, with the z-axis being the depth below the surface, thus enabling the complete examination of the defect in x, y, and z.

The present invention utilizes the pseudo cross sectioning technique for locating the process step at which the defects or other abnormalities or discontinuities occurred as described above. In its application in the present invention, the area effectively cross sectioned is minimized to facilitate later FIB refill of the milled cross section area. By way of example, the pseudo cross sectional area may be localized to the immediate area of the via/contact expected to be defective. The cross sectional area is determined by the dimensions of the defective area, such as the via/contact. The FIB-milled area may be as small as 100×100 nm for 90 nm process technology, and will scale downward as process technologies shrink. The ultimate restriction on the minimum dimensions is the spacing between vias, which can be as small as the vias themselves. If, as the milled area becomes small enough in cross section and high enough aspect ratio that gas flow into the milled region is impeded, the number of pixels (dwell points) in the mill is reduced so as to give the gas time to repopulate the surface.

The set of pseudo-cross sections gives information on the three-dimensional structure of the area viewed, but does not give as much materials information as does an SEM cross section. This is because the SEM knocks out core electrons, and the higher orbital transitions can occur which tend to produce x-rays which can be detected by Energy Dispersive X-ray analysis (EDX). However, some materials information is provided by the pseudo-cross section technique due to the differences in secondary electron SE coefficients between materials: generally Al and Cu yield a higher SE signal than does W, which is higher than C, etc. Dielectric materials generally appear dark due to local surface charging. The pseudo-cross section technique is particularly well suited to examining defects or other abnormalities and/or discontinuities in a single-material case, such as a via.

A method and a system for implementing the detection of a discontinuity such as an abnormality, known as Fireflies, can be extremely useful in correlating the cross-section data to locate abnormal discontinuities. Fireflies provides an automated technique to monitor secondary information generated by the FIB and to display detected information, typically prior to human recognition of an endpoint signal, i.e., a recognition of a transition occurring in z space, and thus add sensitivity to a standard end point tool as follows:

Fireflies can apply its cross correlation algorithms for 2D detection and discrimination of a single image plane, to 3D space so as to utilize previous and following collected images.

Figure 5B:
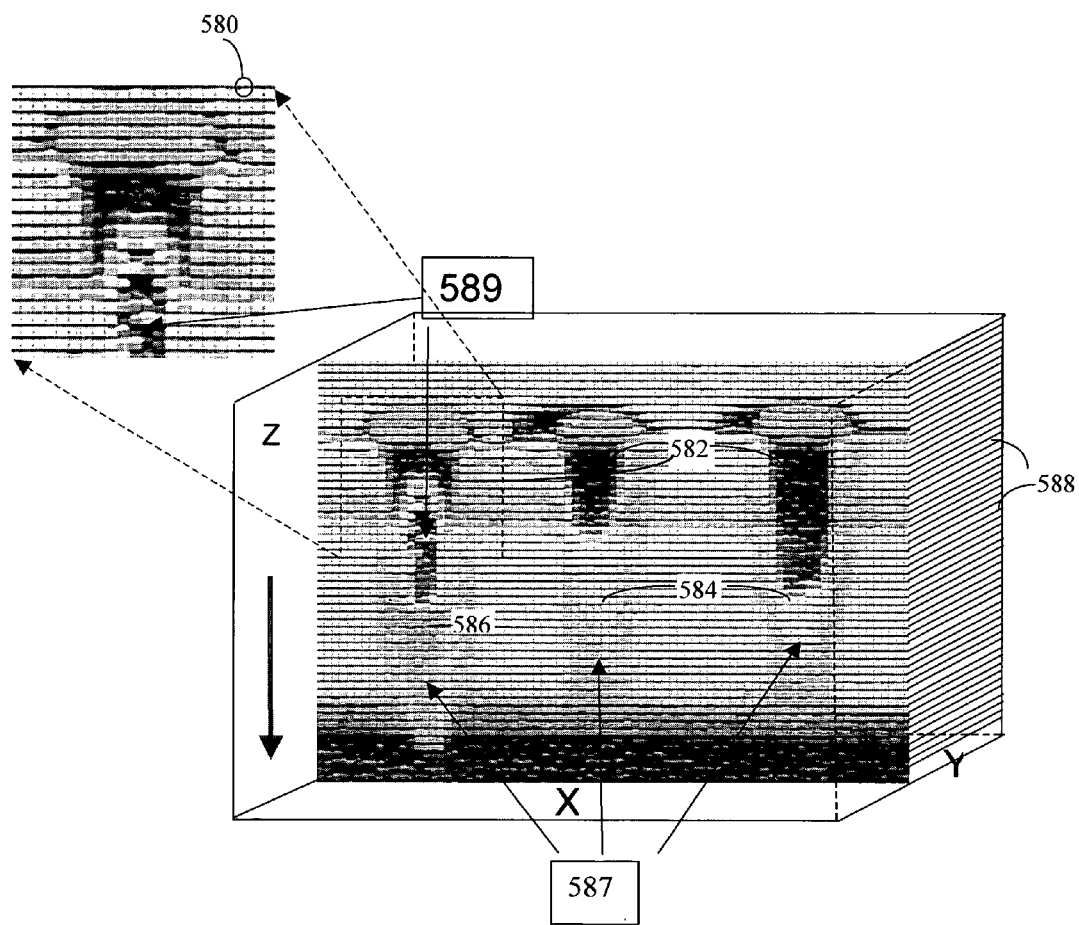
FIG. 5b illustrates a voxel image and its formation.

Firefly cross correlation data can project and mark the potential of an anomalous region or discontinuity growing or diminishing as the FIB deprocessing of an isolated structure proceeds, creating voxels that can be mapped in 3D space. A voxel (a portmanteau of the words volumetric and pixel) is a volume element, representing a value on a regular grid in three dimensional space. FIG. 5*b* illustrates a 3D image composed of voxels and how it is formed from cross section slices. The voxels as utilized in this invention have a width and depth in x,y and a height z in time. Each square 580 (580 denotes a single voxel, circled in the figure, of an approx. 21×21 voxel sub image) represents a volumetric pixel or voxel derived in 3D space from 2D thumbnail image slices. Gray scale information defining anomalies in 3D structure, and time information in the Z axis to define a single voxel. In the figure, dark regions 582 at the tops of vias 584 and 586 denote material composition change, an oxide surrounding a via metal core in these regions. Via 586 is voided in the middle, in region 589, which is the defect. All structures are made up of gray scale voxels 580 that define the size and boundaries of structures and anomalies. 2D. x-y thumbnail slices 588 are used to form the voxel image. These voxels can be displayed in 3D space and further correlation algorithm and temporal filters applied to assemble a colorized image viewable in rotation space. A discontinuity or anomaly is actually identified by a change in signal level which must be greater than the average voxel to voxel noise levels; it would also be advantageous to have the ability to adjust some discriminator level so as to inspect the discontinuity surface. The discontinuity must be distinguishable from some systemic signal change—it must have a surface, it must have a variation in time/Z even if this is very slight, and most generally the surface would show a change with x,y.

The grayscale is converted into some other colorization scheme assigned to the intensity level in each voxel. A default grayscale palette would provide a linear scale of grays between black for no intensity and white for maximum intensity level. Several other palettes would supply a false color rendering of the 3-D image, which could make small variations in intensity levels more noticeable. Some palettes of particular interest would include a thermal palette ranging from black to white through the range of reds and yellows, and a red-green-cyan palette where low signal is a deep red, medium signal is a solid green and high signal is a bright cyan such as in FIB Assist. An automated method could result in the surface of the discontinuity becoming the edge for this color change. One filtering step that can also be applied to enhance the "visibility of the discontinuity would be an edge enhancement algorithm, again similar to what is in FIB Assist.

The Fireflies system and method is described in detail in U.S. patent application Ser. No. 11/607,337, filed Nov. 30, 2006, which is hereby incorporated by reference in its entirety.

Additional data and image analysis aspects of the present invention, including the application of the Firefly technology to the present invention, are summarized as follows:

a) Utilizing this same technology, Firefly methodology can be applied to each thumbnail image frame collected and "search" for differences and high light these in each frame in color by some delineation fashion.

b) Further, these delineations will be pre-marked in the next incoming image frame, and again the Firefly algorithm and filters would search this area as well as the rest of the image frame or plane for other differences. By doing this we would assemble a convergence which would even converge when the discontinuity is somewhat buried in noise. For example when the signal is weak then the surface is indistinct or vague yet a surface could be traced out. This "ghost" discontinuity when it can not be correlated to some library would be judged as insufficient until the die is repaired and proven to work, whereupon the "ghost" discontinuity becomes the explanation. However it would not be installed into the library as it was too indistinct. Further the Fire Flies could compare information to a "reference"; that is of a typical via structure and composition that is good electrically. A deprocessing would need to be performed to collect this "reference" data for a look-up library for comparisons to failing vias.

c) This 3D mapping will define voxels in 3D space that can be assembled in the cross section volume, or more exactly, display only these differences to define a unique structure or empty space, as the anomaly inducing failure. This voxel map can be separated or merged with all data, assembling a virtual cross section map when one of the reference axes is time.

d) Upon complete assembly and not necessarily performed in real time, the Firefly algorithms and filtering can be performed in the x,y, and z directions for the entire volume of images collected and assembled. By applying enhancement filters such as edge enhancement the anomaly can be further sharpened and further isolated and ideally further classified.

e) Applying a colorized grayscale filter during a single frame thumbnail collection or between 2 or more frames during chemistry deprocessing of a site suspected of interest, could be assembled similar to a "Doppler shift" image where edge or structure delineation is further enhanced to quantify the anomaly as a void, mass, etc. A "Doppler shift" image is a set of at least three grayscale images of the same structure but taken with different wavelengths of light and combined by assigning one of red, green or blue to each of these different wavelength image. This pseudo-coloring methodology will be designated "RGB (red-green-blue) imaging" This would bring significant value at a transition point. RGB imaging is a function of closely spaced thumbnail slices, where one has one filter/colorization applied, and the previous slice, or immediately following slice has still different filter/colorization parameters applied, and then the 3 are merged or discriminated against with the resultant being an RGB image, which brings out for the human eye still some greater detail.

f) CAD typically from GDS data and displayed in 2D space could be interlaced through the 3D circuit volume contained in the virtual cross section space. The 3D thickness of CAD would then be applied from a "technology file", which provides vertical information, and registered to the core volume of circuit layers contained in the cross section space. This would enable readily identifiable process location in the captured and deprocessed structure. The added value of this is where multiple layers of more than 2 metallization layers are contained in the virtual core sample or cross section space.

g) Boolean functions of merging CAD into and through a 3D volume available for viewing at any angle, can stay registered to and through said volume for better identification and isolation of anomalies.

h) Further, based on the same 3D CAD implementation to the 3D structure, and with Net list data and more ideally signal and bias information, neighboring traces can be viewed in 3D space and capacitive or resistive models for SPICE or other simulations can aid in field, cross talk, and leakage probability as a Failure Analysis tool. This would have application to searching for a short.

An apparatus which would enhance data processing and analysis as outlined above could include: a CMP navigator or electronic beam deflection stage in concert with an analysis tool that would help reduce the probability of failing locations within a via or interconnect, where suggested x, y, z nodes are to be opened and probed mechanically or by beam stimulation to further define where the affected connection or connections reside. The value CMP can bring is that several nodes at various metal and contact layers are exposed from FIB gas chemistry operations. Within a single field of view, the ion beam is deflected onto the metal of each of the nodes, and the other nodes are monitored for a change in secondary output. This is performed in an interlaced or multiplexed methodology by the pulsed ion beam where the blanker is synchronized and relative timing and electron generation is collected based on mean free path of signal relative to ground or fundamental stimulus. Reduced or missing signal detected or a change in intensity from one node to the other can provide an increased probability of where an anomaly or defective contact had occurred, providing the analyst a recommended path to follow to isolate the mechanism.

A third aspect of the present invention is the use of the FIB to effect repairs on the defect which has been located using the techniques described above. This aspect of the present invention helps to greatly enhance its effectiveness in enabling quick turnaround times in defect analysis by performing a repair. The ability to effect in situ repairs of defects greatly lowers the time required. The defect repair may consist of several steps, the first of which will generally be milling an opening to remove the defective feature, such as the contact/via. For example, in a case such as that illustrated in FIG. 2, wherein resist residue at the bottom of a via caused an open circuit, the FIB beam could mill away both the metal via fill material and the resist residue, leaving an unfilled newly-milled via. Pseudo cross sectioning during this milling process followed by a FIB-deposited conductor fill would verify that the resist residue was in fact causing the open via. In general, the process is so well defined that definitively knowing the location of a problem identifies the process step it came from and thus the cause. There may be some cases which would require TEM and EDX or EELS analysis to determine the root cause with certainty. There may be some other cases, such as defects in the metallization due to electromigration, where the root cause is due to design rather than process, and even additional analysis by such methods as TEM would not definitively determine the cause.

A repaired die that was pseudo-cross sectioned prior to repair would generally be evident after repair. If the "defect" was milled out and then repaired a standard cross section would show that this had been done. First of all, the device would be examined globally to identify if anything looks to have been edited. An edit area generally shows some remnant overspray from the edit or structural invasiveness into the surface dielectric. From this examination a repair candidate would be evident. Note that a traditional edit via is located where a via would not otherwise be. Secondly, by comparing a standard cross section of a device via to that of the suspicious repair candidate via, the change in shape as well as the change in fill structure and composition through EDX can be revealed. If the fill material is not the copper, aluminum or tungsten of the other vias in the device it is definitely a repair. If the tungsten structure is not the same as the other SEM or SPM imaged cross sections then it is a repair.

A fourth aspect of the invention is automating the defect characterization process by incorporating a computer including computer software to control and or direct/guide the process. The computer software control can include image processing, frequency scanning in conjunction with the image processing in order to optimize the image, optimization of probe positioning (described in U.S. application Ser. No. 11/502,951, filed on Aug. 11, 2006, which is hereby incorporated by reference), automated endpoint analysis (described in U.S. Provisional Application No. 60/849,044, filed on Oct. 3, 2006, which is hereby incorporated by reference).

Figure 6A:
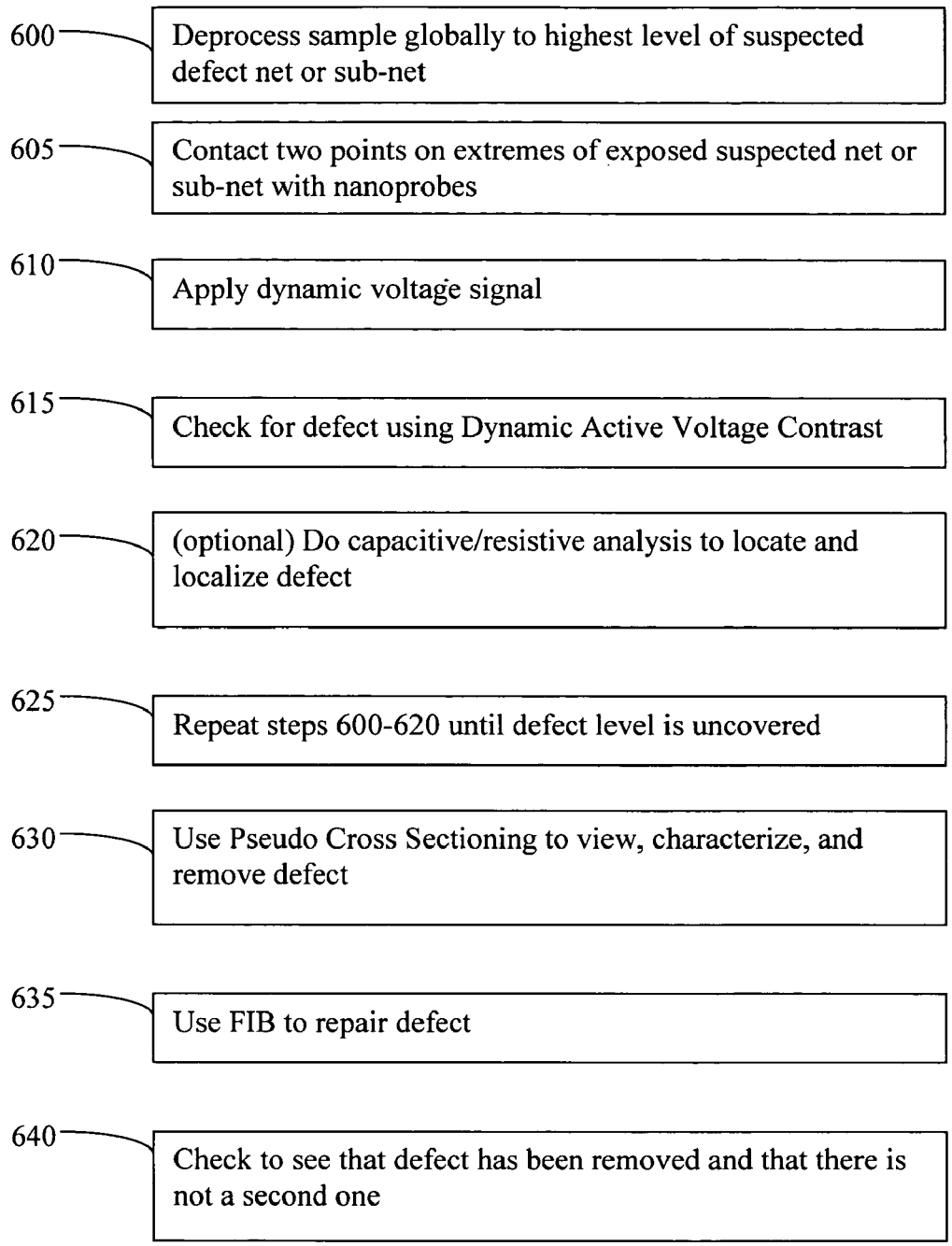
FIG. 6a summarizes a first embodiment of the process flow of the present invention.

FIG. 6a summarizes a first embodiment of a process flow of the present invention.

In step 600, deprocess sample globally to highest suspected level of defect, using FIB.

In step 605, contact two points on suspected net or sub-net with nanoprobes.

In step 610, apply dynamic voltage signal.

In step 615, check for defect on that level using DAVC.

In step 620, (optional), do capacitative and/or resistive analysis to locate and localize the defect.

In step 625, repeat steps 600-620 in a loop: continue deprocessing and checking for defect until defect level uncovered.

In step 630, use pseudo-cross sectioning to view and characterize defect (i.e., determine root cause) while removing it.

In step 635, use FIB to repair the defect.

In step 640 check to see that defect has been removed.

Figure 6B:
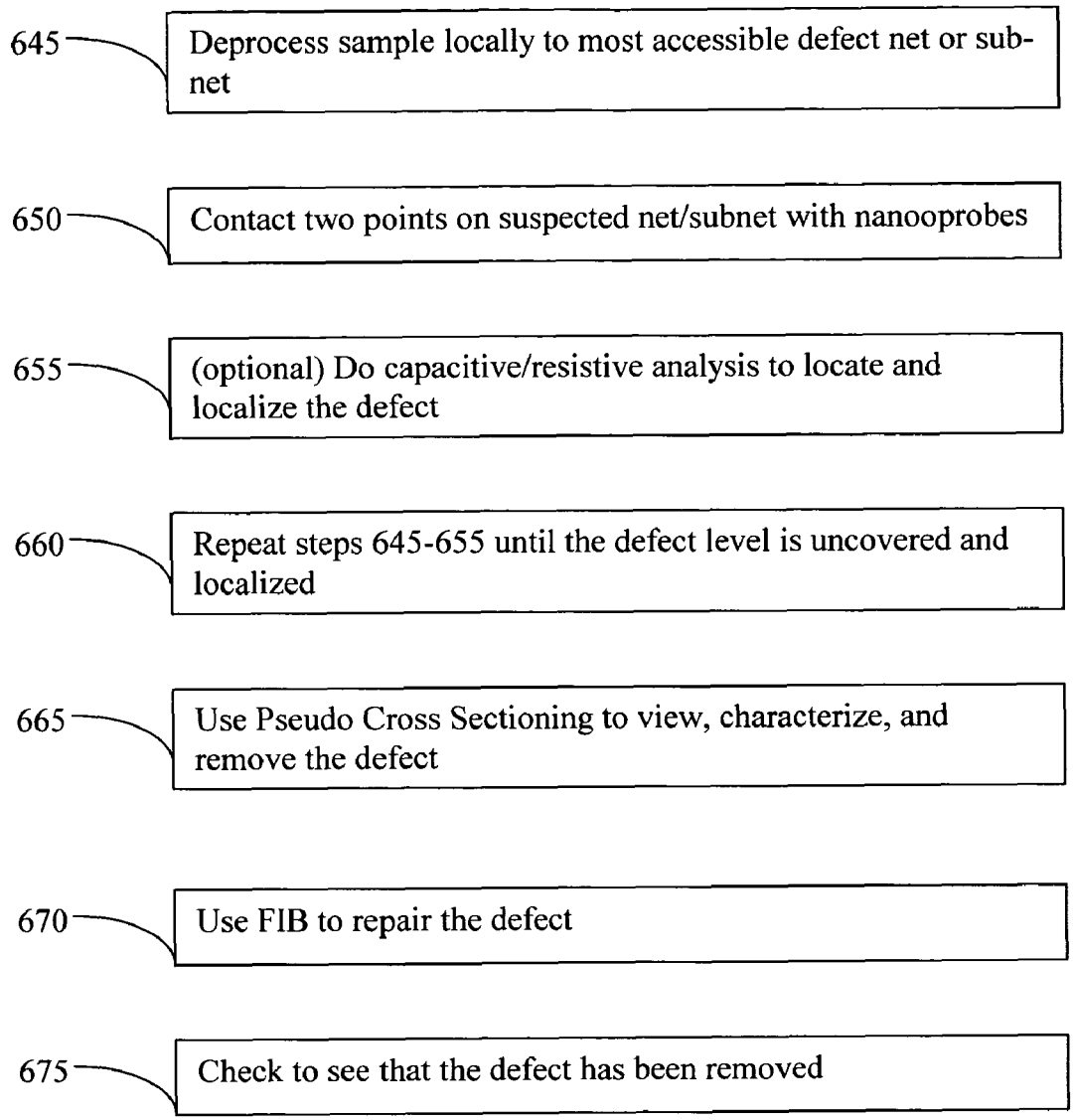
FIG. 6b summarizes a second embodiment of the process flow of the present invention.

FIG. 6b illustrates a second embodiment of a process flow of the present invention.

In step 645, deprocess the sample locally to the most accessible suspected defect net or sub-net.

In step 650, contact two points on the suspected net or sub-net with nanoprobes.

In step 655, do capacitative and/or resistive analysis to locate and localize the defect.

In step 660, repeat steps 645-655 until the defect level is uncovered and localized.

In step 665, use Pseudo-Cross Sectioning to view, characterize, and remove the defect.

In step 670, use FIB to repair the defect.

In step 675, check to see that the defect has been removed.

Comparisons to known good die or to simulated CAD/SPICE can be useful or even essential in either process flow. It is also possible to combine the above two embodiments. The process flow can move from that of FIG. 6a to that of FIG. 6b, although it is clumsy moving back and forth from the global deprocessing tools to the FIB. The flow can also move from that of FIG. 6b to that of FIG. 6a, although that would not be as usual. It might be appropriate when the defective net or sub-net is not clear.

Figure 7:
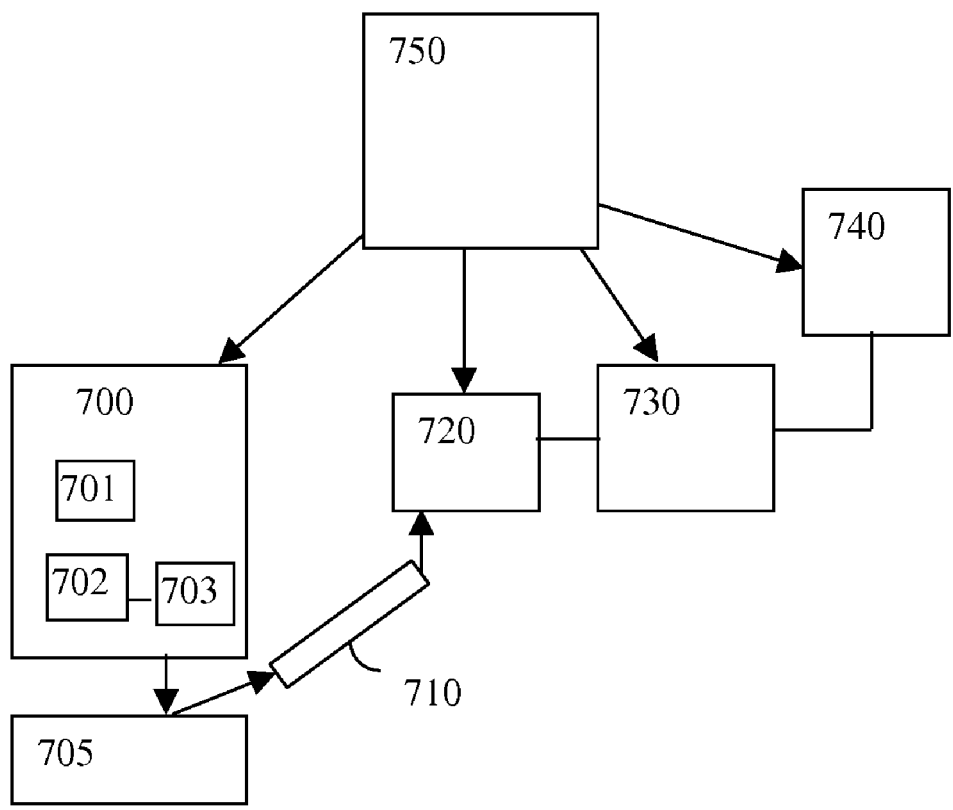
FIG. 7 shows a block diagram of an apparatus for implementing the present invention.

FIG. 7 shows a block diagram of an embodiment of a system/apparatus for implementing the method of the present invention. Shown are:

a) a focused ion beam (FIB) system 700 to scan the ion beam over the contact/via of sample 705 so as to remove or deposit via material. The FIB system may include a chemistry delivery system 701 configured to assist in the removal of materials. Generally this assistance would be desired to accelerate the removal, but for better delineation the chemistry could slow down a process or the chemistry could enhance the discontinuity, i.e., improve the signal to noise ratio. Scanning probe system 702 including mechanical probing needle 703 is shown in situ with FIB system 700;

b) a detector 710 to collect a secondary particle (e.g., electron) signal from the contact/via material that gets removed;

c) a first sub-system 720 for storing the secondary particle signal from the contact/via in time as well as x-y scan position, which may be FIB Assist hardware and software by way of example;

d) a second sub-system 730 for correlating secondary particle signals and identifying discontinuities in the correlated secondary particle signals. A discontinuity may be a material defect, by way of example. The discontinuity may be identified by a change in signal level, which must be greater than the voxel to voxel noise levels (if the average voxel level changes to another average level and the change is actually less than the voxel noise level, the level change would still be detectable and useful in identifying a discontinuity); it would also be advantageous to have the ability to adjust a discriminator level so as to inspect the discontinuity surface. The second sub-system may be configured to highlight the FIB Assist virtual cross section image where the discontinuity shows its largest extent in x-y and time.

e) a third sub-system 740 for optimizing the display of the abnormal discontinuity, which may use Fireflies. The abnormal discontinuity signal may be displayed as a 3-d surface, and/or as a cross section which can actually be rotated by the user so as to inspect the nature of the discontinuity and thus classify it against a library; and f) a computer 750 configured to implement software aspects of a)-e). By way of example, the computer generally controls the scanning of the FIB system. The scanning may be controlled so that the removal of the via material extends into adjacent regions so as to produce a lateral discontinuity in the secondary particle signal. The scanning may be controlled so that the removal of the contact/via material is stopped when some portion of the adjacent material shows a discontinuity which indicates that a horizontal trace has been reached. The second sub-system can then convert the time to reach the horizontal trace into a metric for placing the discontinuity as a percentage of the mill time to remove the via material. The computer can also control the chemistry delivery system. For example, chemistry may be injected after the stopping of the removal of the via material s as to deposit conductive material into the removed via and recreate a via in place of the removed via.

Data from the computer can be stored on a data storage medium, for example pseudo-cross section images, on which correlation data would allow identification of a defect is highlighted.

Our invention provides an improved method, apparatus, and control/guiding software for localizing, characterizing, and correcting defects in integrated circuits, particularly open or resistive contact/via defects and metal bridging defects, using FIB technology. This is especially useful when using CAD simulated VC and SPICE models. When a "golden" (aka defect free) sample is available the image processing and recognition is of particular value. It should be apparent to those skilled in the art that changes and modifications can be made to the exact embodiments described herein, without departing from the inventive concept. By way of example, other methods of capacitive or resistive analysis for the purpose of localizing detected defects can be utilized. Inductive analysis can also be used. The scope of the invention should be construed in view of the claims.

With this in mind, we claim:

1. An apparatus for identifying an abnormal discontinuity in a vertical conducting connection (contact/via) in an integrated circuit comprising:
   a) a focused ion beam system to scan an ion beam over the contact/via so as to do at least one of: removing and depositing contact/via material;
   b) a detector to collect a secondary particle signal from the contact/via material that gets removed;
   c) a first sub-system for storing the secondary particle signal from the contact/via in time as well as x-y scan position;
   d) a second sub-system for correlating secondary particle signals and identifying discontinuities in the correlated secondary particle signals;
   e) a third sub-system for optimizing a display of the abnormal discontinuity; and
   f) a computer configured to implement software aspects of a)-e).

2. The apparatus of claim 1 wherein said first sub-system comprises FIB Assist hardware and software, said first sub-system providing a FIB Assist pseudo-cross section.

3. The apparatus of claim 2 wherein said second sub-system is configured to highlight the FIB Assist pseudo cross section image where the discontinuity shows its largest extent in x-y and time.

4. A data storage medium containing a pseudo-cross-section image as in claim 2 of a suspected defective region of an IC, on which correlation data which would allow identification of a defect is highlighted.

5. The apparatus of claim 1 wherein the discontinuity is a material defect.

6. The apparatus of claim 1 wherein the focused ion beam system for removal of material includes a chemistry delivery system configured to assist said removal of material by a chemistry.

7. The apparatus of claim 1 wherein the secondary particles are electrons.

8. The apparatus of claim 1 wherein the third subsystem is configured to use Fireflies to assist the display of the discontinuity.

9. The apparatus of claim 1 wherein said computer is configured to control said scanning so that the removal of the via material extends into adjacent regions so as to produce a lateral discontinuity in the secondary particle signal.

10. The apparatus of claim 9 wherein the computer is configured to control said scanning such that the scanning to remove the via material is stopped when some portion of the adjacent material shows a discontinuity which indicates a horizontal trace has been reached.

11. The apparatus of claim 10 wherein said second sub-system is configured to convert time to reach said horizontal trace into a metric for placing said discontinuity as a percentage of mill time to remove said via material.

12. The apparatus of claim 10 including a chemistry delivery system configured to assist said removal of material by a chemistry, wherein said chemistry delivery system is configured such that said chemistry is injected after the stopping of the removal of said via material so as to deposit conductive material into the removed via and recreate a via in place of said removed via.

13. The apparatus of claim 1 including means for localizing said abnormal discontinuity in said contact/via by a defect localization methodology.

14. The apparatus of claim 13 wherein said means for localizing said abnormal discontinuity in said contact/via includes a mechanical probing needle.

15. The apparatus of claim 14 wherein said mechanical probing needle is sub-micron.

16. The apparatus of claim 15 wherein the sub-micron probing needle is from a scanning probe microscope.

17. The apparatus of claim 15 wherein the scanning probe microscope is in situ with the FIB system.

18. The apparatus of claim 1 wherein said third sub-system is configured to display said abnormal discontinuity signal as a 3-d surface.

19. The apparatus of claim 1 wherein said third sub-system is configured to display said abnormal discontinuity as a cross section which can actually be rotated by the user so as to inspect the nature of the discontinuity and thus classify it against a library.

20. The apparatus of claim 19 wherein the scanning of the ion beam is moved to consecutive vias to investigate discontinuities in them.

* * * * *